(12) United States Patent
Kurt et al.

(10) Patent No.: US 7,776,390 B2
(45) Date of Patent: Aug. 17, 2010

(54) FILTER WINDOW MANUFACTURING METHOD

(75) Inventors: Ralph Kurt, Eindhoven (NL); Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 405 days.

(21) Appl. No.: 11/878,989

(22) Filed: Jul. 30, 2007

(65) Prior Publication Data

US 2008/0254211 A1 Oct. 16, 2008

Related U.S. Application Data

(62) Division of application No. 10/887,329, filed on Jul. 9, 2004, now Pat. No. 7,456,932.

(30) Foreign Application Priority Data

Jul. 25, 2003 (EP) .................. 03077350

(51) Int. Cl.
   *B05D 5/06* (2006.01)
(52) U.S. Cl. .................. 427/164; 427/226; 216/24
(58) Field of Classification Search .................. 427/164, 427/226; 216/24
   See application file for complete search history.

(56) References Cited

U.S. PATENT DOCUMENTS

| | | | |
|---|---|---|---|
| 3,960,562 A * | 6/1976 | Feist | 430/314 |
| 4,861,402 A * | 8/1989 | Gordon | 156/108 |
| 5,296,891 A | 3/1994 | Vogt et al. | |
| 5,523,193 A | 6/1996 | Nelson | |
| 5,965,065 A | 10/1999 | Powell | |
| 5,969,441 A | 10/1999 | Loopstra et al. | |
| 6,046,792 A | 4/2000 | Van Der Werf et al. | |
| 6,459,472 B1 | 10/2002 | De Jager et al. | |
| 6,623,893 B1 * | 9/2003 | Levinson et al. | 430/5 |
| 2003/0057804 A1 * | 3/2003 | Uchiyama et al. | 310/311 |
| 2003/0203547 A1 * | 10/2003 | Sakaguchi et al. | 438/151 |

FOREIGN PATENT DOCUMENTS

| | | | |
|---|---|---|---|
| EP | 1 065 568 | | 1/2001 |
| JP | 53-102400 | | 9/1978 |
| JP | 58100803 A | * | 6/1983 |
| JP | 03102300 A | * | 4/1991 |
| JP | 6-216000 | | 8/1994 |
| JP | 09-306825 | | 11/1997 |
| JP | 2000-323396 | | 11/2000 |
| JP | 2001-326162 | | 11/2001 |

(Continued)

OTHER PUBLICATIONS

Wedowski, Machine translation: WO 02059905, Oct. 7, 2009.*
Bristol et al., Silicon Diffraction Gratings for use in the Far- and Extreme-Ultraviolet, SPIE, vol. 3114, pp. 580-585, 1997.*

(Continued)

*Primary Examiner*—Michael Cleveland
*Assistant Examiner*—Tabatha Penny
(74) *Attorney, Agent, or Firm*—Pillsbury Winthrop Shaw Pittman, LLP

(57) ABSTRACT

A filter window manufacturing method includes fabricating a structure of wires on a substrate, depositing a lacquer over the wires and the substrate, depositing a first layer that includes a material selected from the group consisting of AlN, Ru, Ir, Au, SiN, Rh, C and combinations thereof, removing the lacquer, removing the substrate, and baking the first layer.

6 Claims, 3 Drawing Sheets

FOREIGN PATENT DOCUMENTS

| | | |
|---|---|---|
| JP | 2002-208313 | 7/2002 |
| JP | 2002-359180 | 12/2002 |
| JP | 2003-163159 | 6/2003 |
| JP | 2004-186179 | 7/2004 |
| WO | WO 01/81907 A1 | 11/2001 |
| WO | WO 02/059905 | 8/2002 |

OTHER PUBLICATIONS

Powell et al., "Filter Windows for EUV Lithography," *Proceedings of SPIE*, vol. 4343, 2001, pp. 585-589, XP-002287402.

Japanese Official Action issued for Japanese Patent Application No. 2004-222768, dated Jul. 6, 2007.

\* cited by examiner

FILTER WINDOW MANUFACTURING METHOD

This application is a divisional application of U.S. patent application Ser. No. 10/887,329, filed Jul. 9, 2004 now U.S. Pat. No. 7,456,932, which claims priority from European Patent Application No. 03077350.1, filed Jul. 25, 2003, both of which are incorporated herein by reference in their entireties.

1. FIELD OF THE INVENTION

The present invention relates generally to lithographic projection apparatus and more particularly to filter windows for use therewith.

2. DESCRIPTION OF THE RELATED ART

The term "patterning device" as here employed should be broadly interpreted as referring to devices which can be used to endow an incoming radiation beam with a patterned cross section, corresponding to a pattern which is to be created in a target portion of the substrate. The term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix addressable surface. The required matrix addressing can be performed using suitable electronic circuitry. More information on such mirror arrays can be gleaned, for example, from U.S. Pat. No. 5,296,891 and U.S. Pat. No. 5,523,193, which are incorporated herein by reference. In the case of a programmable mirror array, the said support structure may be embodied as a frame or table, for example, which may be fixed or movable as required.

SUMMARY OF THE INVENTION

For purposes of simplicity, the rest of this text may, at certain locations, specifically direct itself to examples involving a mask and mask table; however, the general principles discussed in such instances should be seen in the broader context of the patterning device as here above set forth.

Lithographic projection apparatus can be used, for example, in the manufacture of integrated circuits (ICs). In such a case, the patterning device may generate a circuit pattern corresponding to an individual layer of the IC. This pattern can be imaged onto a target portion (e.g. comprising one or more dies) on a substrate (silicon wafer) which has been coated with a layer of radiation sensitive material (resist). In general, a single wafer will contain a whole network of adjacent target portions, which are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate which is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo-mechanical polishing, etc., all intended to finish off an individual layer. If several layers are required, then the whole procedure or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book *Microchip Fabrication: A Practical Guide to Semiconductor Processing*, Third Edition, by Peter van Zant, McGraw Hill Publishing Co., 1997, ISBN 0-07-067250-4, incorporated herein by reference.

In a lithographic projection apparatus, it is necessary to prevent any stray particles, which may be present in the apparatus from reaching, and becoming stuck to, the mask as they will then be imaged on the substrate and can be printed in the final device. Too high a level of contamination of the mask can lead to defective devices and the masks cannot generally be cleaned, or if cleanable, can only be cleaned a limited number of times. In a lithographic projection apparatus using relatively long wavelength ultraviolet radiation, particles are prevented from reaching the mask by a pellicle. A pellicle is a thin membrane transparent to the radiation used in the projection beam of the lithographic apparatus and located parallel to but spaced from the mask. Contaminant particles moving towards the mask contact and stick to the pellicle. To ensure that the particles stuck to the pellicle are not printed on the substrate, the pellicle is spaced from the mask by a distance greater than the depth of focus at mask level.

At the Engineering Test Stand (ETS) of Sandia National Labs, thin filter windows are used which are mounted in a revolver like set-up allowing a fast replacement. Due to molecular contamination and irradiation damage they have to be changed frequently. State of the art and commercially available filters and pellicles (such as Si, C and Zr) are typically characterized by a relative high absorption of about 50% (at 13.5 nm wavelength, due to the fact that no EUV-transparent material exist), corresponding to a thickness between 200 nm and about 1 µm, as provided by LOT-Oriel GmbH & Co KG, Darmstadt, Germany. Usually they also have a mechanical supporting structure consisting of a mesh of thin wires, whereby the wires absorb EUV-light. To make these structures pinhole free is also a technical challenge.

In EUV lithographic projection apparatus, a dynamic gas lock (DGL) is used to separate e.g. a wafer compartment from a projection optics (PO) box, see U.S. Pat. No. 6,459,472. Such a DGL has to suppress various contamination sources (hydrocarbons and water). Recently it was found that the combination of EUV radiation, high pressures (e.g. ~0.1 Pa Ar) and electric fields cause a sputter risk, which might result in serious damage of sensitive parts of the optics. It is therefore desired to lower the total pressure in the vacuum system. But at lower pressure the DGL can not work efficiently. Therefore alternative solutions are required.

It is an object of the present invention to provide a filter window which has a EUV transmittance of about 50% at 13.5 nm wavelength and which is mechanically stable and long time resistant against EUV and heat radiation.

According to the present invention there is provided a filter window as described in the preamble, characterized in that the pellicle comprises a first layer comprising at least one of AlN, Ru, Ir, Au, SiN, Rh, and C. A pellicle with these materials has a very low EUV absorption in combination with a minimal oxidation rate.

In one embodiment a thickness of the pellicle is between 30 nm and 100 nm. It can be easily checked that the absorbance for EUV radiation of such a thin pellicle is substantially equal to the absorbance of known filter windows for such radiation, i.e. about 50% at a wavelength of 13.5 nm wavelength, but the oxidation of the pellicle according to the invention is much less.

In another embodiment, the pellicle comprises a second and a third layer, wherein said second layer is arranged between the first and the third layer. In this embodiment, the absorption is significantly reduced when using for example Si or Al in a sandwich structure between the first and the third layer. The second layer may comprise at least one of Si, Be, B4C, Mo, Zr, Nb, C, Al. These materials are all more or less "EUV transparent" materials.

In yet another embodiment, the second layer comprises elevated bars on top of a base layer. A simple structure of bars of 200 nm width, 400 nm height, and a pitch of 1000 nm on a 100 nm thin silicon filter (serving as base layer) reduces the transmission of this filter to a value lower than 4% in the Infra Red wavelength region from 1500 to 2000 nm. Silicon is optically almost equal to vacuum for EUV radiation, so the EUV-projection beam is not significantly affected by this bar structure. The elevated bars may comprise Si. Silicon is advantageous because Si has a high transmittance for Infra Red radiation, and bar structures of Si can be exploited to manipulate Infra Red radiation traversing or impinging on such a bar structure in the Infra Red as well.

A pitch between the bars may be in the range of 500-5000 nm and a height of the bars is in the range of 200-500 nm. In a specific embodiment, the pitch of the bars is 1000 nm and the height of the bars is 400 nm.

The filter window may comprise a wire structure comprising metal wires, wherein the distance between the wires, in at least one direction, is of the magnitude of millimeters. High throughput of exposed wafer in an EUV lithography production tool can only be obtained by using a relatively large illuminated area being an opening between the Projection Optics box and wafer compartment. Wide spaced wires will increase the illuminated area, and thus increase throughput.

Furthermore, the present invention also provides a lithographic projection apparatus as described above, comprising a filter window as described above.

The present invention also provides a filter window manufacturing method. Furthermore, the invention relates a device manufacturing method and a device manufactured in accordance with such a method.

The invention also relates to a filter window manufacturing method including providing a substrate which is at least partially covered by a layer of radiation sensitive material to a substrate table, providing a projection beam of radiation using a radiation system, using a patterning device to endow the projection beam with a pattern in its cross section, projecting the patterned beam of radiation onto a target portion of the layer of radiation sensitive material, and using a filter window as described above.

Finally the invention relates to a device, such as a IC device, manufactured in accordance with this method.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin-film magnetic heads, etc. The skilled person will appreciate that, in the context of such alternative applications, any use of the terms "reticle", "wafer" or "die" in this text should be considered as being replaced by the more general terms "mask", "substrate" and "target portion", respectively.

In the present document the term "radiation" and "beam" are used to encompass all types of EUV radiation (extreme ultraviolet radiation, e.g. having a wavelength in the range 5 nm to 20 nm).

BRIEF DESCRIPTION OF THE DRAWINGS

The present invention and its attendant advantages will be described below with reference to exemplary embodiments and the accompanying schematic drawings, in which.

DETAILED DESCRIPTION

Figure 1:
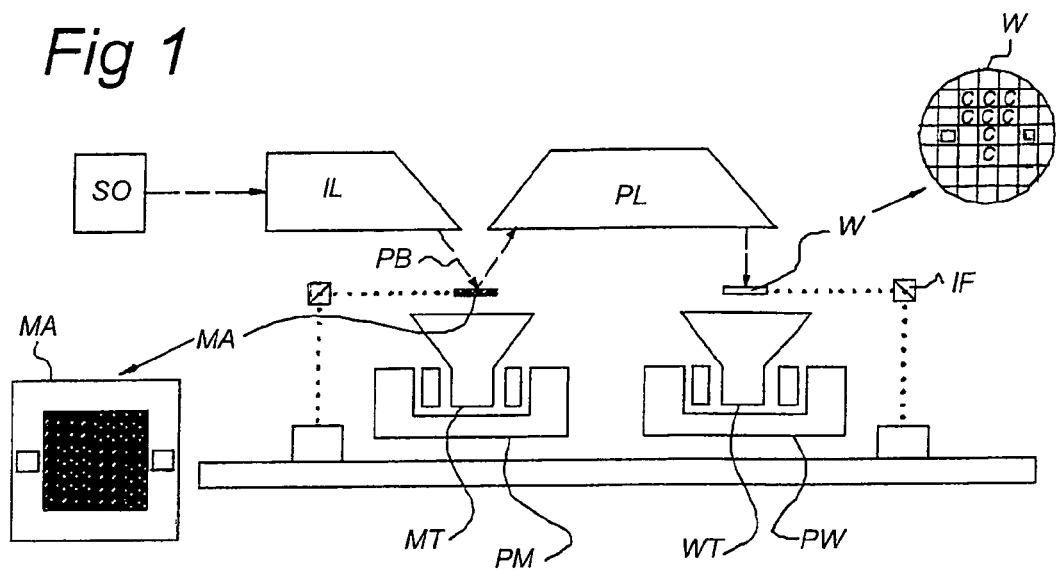
FIG. 1 depicts a lithographic projection apparatus according to an embodiment of the invention.

FIG. 1 schematically depicts a lithographic projection apparatus according to a particular embodiment of the invention. The apparatus comprises:

a radiation system IL, for supplying a projection beam PB of radiation (e.g. EUV radiation), which in this particular case also comprises a radiation source LA;

a mask table MT provided with a mask holder for holding a mask MA (e.g. a reticle), and connected to first positioner PM for accurately positioning the mask with respect to item PL;

a substrate table WT provided with a substrate holder for holding a substrate W (e.g. a resist coated silicon wafer), and connected to second positioner PW for accurately positioning the substrate with respect to item PL;

a projection system ("lens") PL (e.g. a mirror system) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source SO (e.g. a discharge or laser produced plasma source) produces a beam of radiation. This beam is fed into an illumination system (illuminator) IL, either directly or after having traversed conditioning optical elements. The illuminator IL may comprise adjustable optical elements for setting the outer and/or inner radial extent (commonly referred to as σ-outer and σ-inner, respectively) of the intensity distribution in the beam. In addition, it will generally comprise various other components, such as an integrator and a condenser. In this way, the beam PB impinging on the mask MA has a desired intensity distribution in its cross-section.

It should be noted with regard to FIG. 1 that the source SO may be within the housing of the lithographic projection apparatus, but that it may also be remote from the lithographic projection apparatus, the radiation beam which it produces being led into the apparatus (e.g. with the aid of suitable directing mirrors). The current invention and Claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioner PW (and interferometer IF), the substrate table WT can be moved accurately, e.g. so as to position different target portions C in the path of the beam PB. Similarly, the first positioner PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so called "scan direction", e.g. the y-direction) with a speed v, so that the projection beam PB is caused to scan over a mask image. Concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 2:
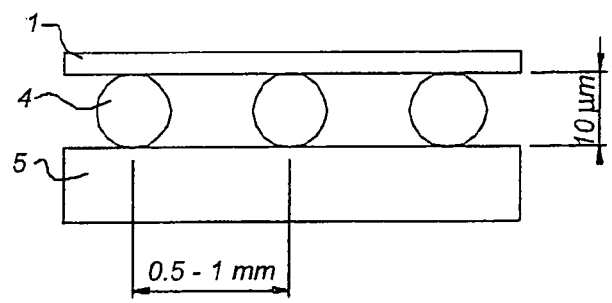
FIG. 2 is a cross-section of a filter window in the first embodiment of the present invention.

FIG. 2 shows a cross-sectional view of a pellicle 1 according to the present invention, which is still attached to a substrate 5. The pellicle 1 comprises a thin film, which for example is made of AlN. The pellicle 1 is supported by a wire structure having wires 4. The wire structure may be a mesh of metal wires. Typical values for the thickness of the pellicle 1 according to the invention are 30-100 nm. Typical values for the thickness of the wires 4 are 5-20 μm. In FIG. 2, the substrate 5 is shown. However, the substrate 5 will be removed to leave an almost free-standing pellicle, that is, free standing in one direction.

Figure 3A:
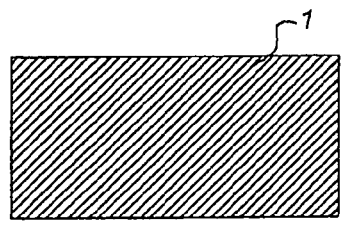
FIGS. 3A, 3B show two different embodiment of a filter window according to the invention.

FIG. 3A shows an embodiment of the pellicle 1. The pellicle 1 comprises a single layer of AlN which has a thickness of approximately 30 nm. There is experimental evidence that these AlN layers treated in the proper way, withstand very long time irradiation (15.000 hours at vacuum ~10-7 mbar H2O). Furthermore an AlN layer is a very good passivation layer and allows handling in air without surface degradation, which is a big advantage taking all the maintenance steps into account.

Figure 3B:
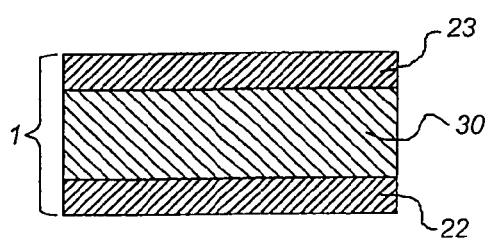

FIG. 3B shows another embodiment of the pellicle 1. In this embodiment, the pellicle 1 comprises three layers. A first layer 22, which may be of AlN, a middle layer 30 which may be of Si, and a third layer 23, which may also be of AlN. The first and third layer can also be realized with "standard cap" materials such as Ru, Ir, and Au (see for instance EP 1,065, 568 A2). A stack consisting of 5 nm AlN-50 nm Si-5 nm AlN results in 73% EUV-transmission. A similar result is obtained with 5 nm Ru-50 nm Si-5 nm Ru. Note that in the case of a Si middle layer, silicide formation has to be prevented by adding proper diffusion barriers such as Mo, C, B4C.

In an embodiment, the pellicle according to the invention is used to suppress out-of-band radiation. The deep-ultraviolet (DUV) suppression of a thin filter of almost any material is sufficient for EUV lithography. However, since the pellicle thickness is much smaller than the wavelength of infrared (IR) radiation, the suppression of IR radiation is limited. In the embodiment, a bar structure is arranged on a base layer, in order to decrease the infrared transmission of the pellicle. Silicon is substantially transparent for IR radiation, so a silicon bar structure on the film is proposed, in order to reduce the IR transmission of the pellicle.

Figure 4:
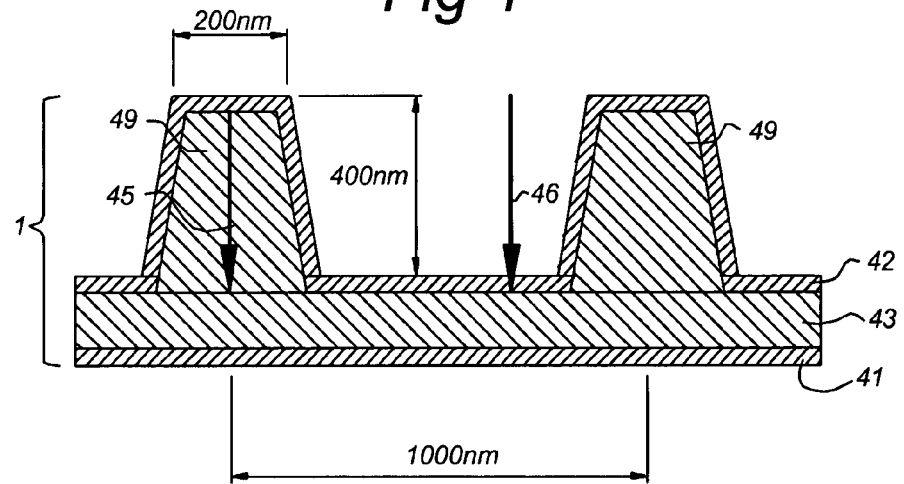
FIG. 4 shows a cross section of a pellicle with a bar structure.

In FIG. 4, a cross section of a pellicle 1 with a bar structure (2 bars are depicted) is given. The pellicle 1 comprises a first layer 41 made AlN. A second layer 43, made of Si, is comprised with bars 49. On top of the bars 49 and the second layer 43, a third layer 42 is arranged. This third layer may also be made of AlN. In FIG. 4 some typical dimensions are indicated. The pitch between the bars 49 is for example 1000 nm. The height of the bars 49 is typically 400 nm and the width of the bars 49 is typically 200 nm. The total pellicle thickness at a spot with no bar is typically 100 nm. This simple structure of bars of 200 nm width, 400 nm height, and a pitch of 1000 nm reduces the transmission of this pellicle to a value lower than 4% in the wavelength region from 1500 to 2000 nm. Silicon is optically almost equal to vacuum for EUV radiation, so the EUV-projection beam is not significantly affected by this phase structure. For 13.5 nm wavelength, approximately 75.3% is transmitted in the zeroth order, while 1.2% is transmitted in higher orders. Note that other structures are also possible, such as for instance two-dimensional gratings, chirped gratings, and other bar structures. Furthermore, note that the influence on the projection beam can be reduced by choosing a proper direction of the bars with respect to the scanning direction. Furthermore, note that the bar structure on the filter can also act as a support structure for the filter increasing its mechanical stability.

In FIG. 4, two arrows represent two rays 45, 46 of infrared radiation. Ray 45 traverses the bar 49, and ray 46 traverses a vacuum space in between two bars. In general, the phase difference between the phases of a ray at two positions traversed by the ray is equal to:

$$\Delta \varphi = \frac{2\pi}{\lambda} \cdot n \cdot d,$$

where $\lambda$ is the wavelength of the light, n is the refractive index of the medium the ray travels through, and d is the distance between the two positions. For the ray 45 this phase difference is:

$$\Delta \varphi_{45} = \frac{2\pi}{\lambda} \cdot n_{Si} \cdot 400 \text{ nm},$$

where $n_{Si}$ is the refractive index of silicon. For the ray 46, this phase difference is $$\Delta \varphi_{46} = \frac{2\pi}{\lambda} \cdot 1 \cdot 400 \text{ nm},$$

since the refractive index of vacuum is unity. The difference between ray 45 and ray 46 result in less transmission of the filter for specific wavelengths, especially infrared. Destructive interference is obtained at $\Delta\phi=180°$.

The proposed thin pellicle is free-standing but still needs a supporting structure. The distance between the mesh wires can be as large as 1 mm and could be several millimeters in at least one direction (these are practical experiences with AlN layers).

Figure 5A:
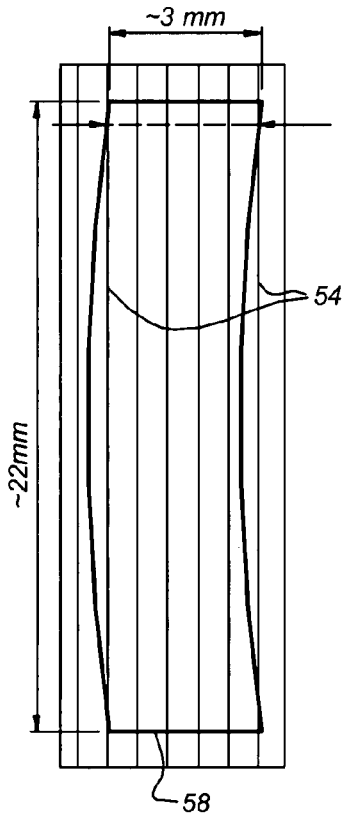
FIGS. 5A, 5B, 5C show a few possible realisations of a supporting wire grid for the filter window according to the invention.

High throughput of exposed wafer in an EUV lithography production tool can only be obtained by using a relatively large illuminated area being a "banana-shaped" opening 8, see FIG. 5A, between a PO-box and a wafer compartment. This "field of the PO-box" will be about 22 mm in length (~die size) and about 3 mm in width as a result of the current optical system design. In fact the resist exposure culminates over approximately 100 EUV pulses during scanning.

Note that the invention is focused on a pellicle, which might be used to separate the PO-box and wafer compartment, but the invention is not restricted to that particular use. Another purpose of such a pellicle could be protection of a reticle, i.e. acting as a shield against particle contamination.

Figure 5B:
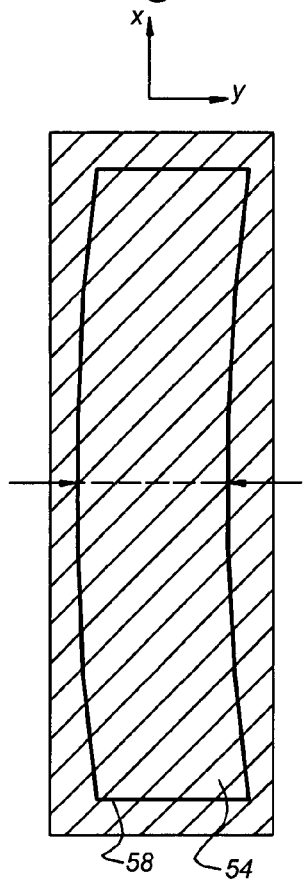
Figure 5C:
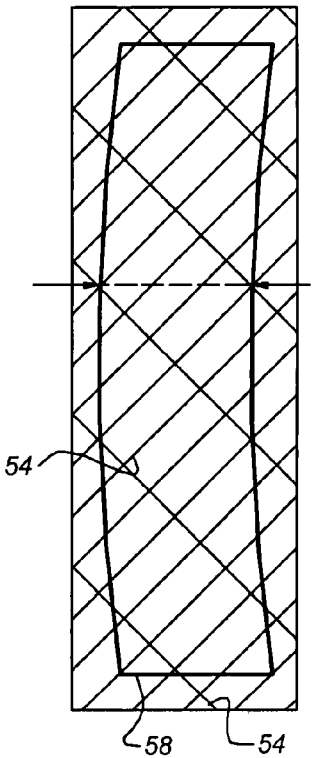

In another aspect of the invention the lithographic projection apparatus comprises a wire structure, wherein each wire of the wire structure is arranged in way that said wire has at least a component perpendicular to a scan direction of said projection apparatus. FIGS. 5A, 5B, 5C show a few possible realizations of a supporting wire grid 54 for the pellicle, placed between the PO-box and wafer compartment. It is important to mention that the wafer (also the reticle) is moved in a predefined direction (y-direction) during exposure. The wires of the wire structure 54 absorb the EUV light totally. It is therefore necessary to limit the number of wires in the "visible" banana-shaped window 58, to allow high optical throughput. FIG. 5A shows a configuration with only four wires perpendicular to the scan direction. Furthermore wires parallel to the y-movement direction are not allowed at all. In order to prevent non-homogeneous illumination of the wafer, the number of mesh-wires has to be identical (an integer) for each x-position on the wafer. That means all points at the wafer have to pass exactly the same number of wires. That requirement is fulfilled in the configurations 5A and 5B. Note that exactly at those x-positions, where one wire leaves the field of the banana shaped window 58, another wire has to enter the window 58 on the opposite side (marked by arrows).

FIG. 5C shows a configuration of a possible mesh with crossings of the wires 54. Such a case (wires in two directions) will provide better mechanical stability but it is difficult to handle with respect to homogeneous illumination. A certain position at the wafer, which moves underneath a crossing of two wires will be exposed more than a position next to it, which "sees" the absorption of two wires instead. In order to minimize this non-homogeneous illumination effect due to crossing, it is proposed to use not more than one wire (within the window 58) of the second direction as illustrated in FIG. 5C.

Yet another important aspect, which has to be considered, is the distance of such a proposed pellicle from either wafer or reticle. As 10 μm thin wires are used, for the supporting structure, and as the numerical aperture of the PO-box is defined (NA=0.25 for wafer, NA=0.05 for reticle) a non-homogeneous illumination intensity of $\Delta I=1\%$ is reached if the mesh (and therefore the pellicle) is placed at least 2 mm or 10 mm away from the wafer and reticle, respectively. These values are quite feasible in the current design.

Figure 6:
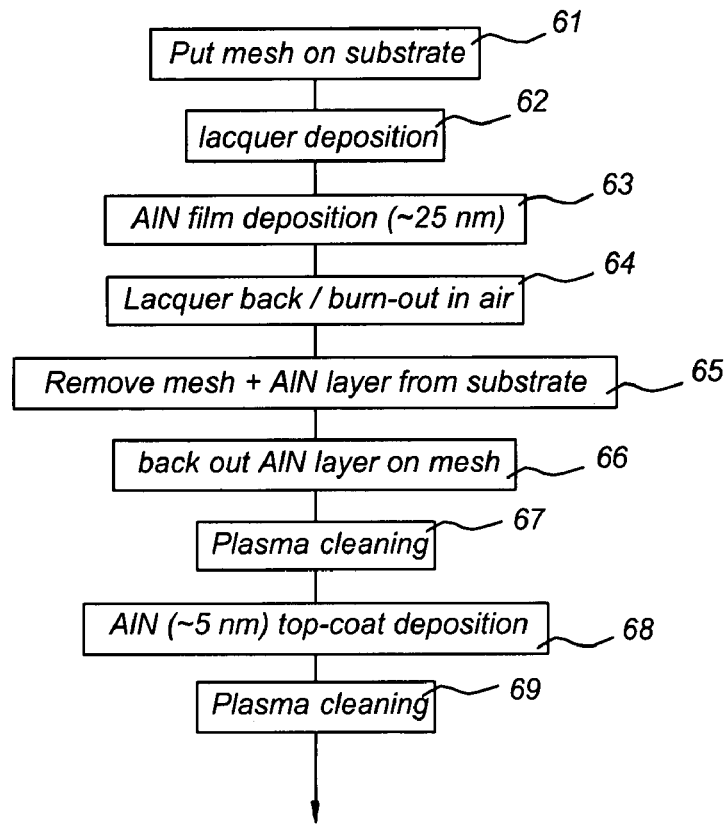
FIG. 6 is a flow diagram of a method for fabricating a filter window according to the invention.

The present invention also relates to a device manufacturing method, for devices like thin filter windows. In FIG. 6, a flow diagram is shown with the respective step of the method. The method starts with step 61 in which a mesh with wires is fabricated on a substrate, as will be clear to a person skilled in the art. Then, in step 62, a lacquer is deposited between the mesh structure. Now, in step 63, a thin film of for example AlN is deposited on the lacquer. Other possible materials for the thin film are Ru, Ir, Au, SiN, Rh or C. Next, see step 64, the lacquer is burnt out by heating the device. The lacquer will vaporize through the AlN film and at the openings at the side of the device. In step 65, the mesh and the AlN layer is remove from the substrate. Then, at step 66, the AlN layer is backed out. After that, at step 67, the AlN layer is cleaned using a plasma cleaning method, as will be described in the following. Next, see step 68, a AlN top coat is deposited on top of the AlN layer. One way of depositing the AlN layer is sputtering. Finally, at step 69, another plasma cleaning step is executed in order to clean (passivate) the surface of the device.

Figure 7:
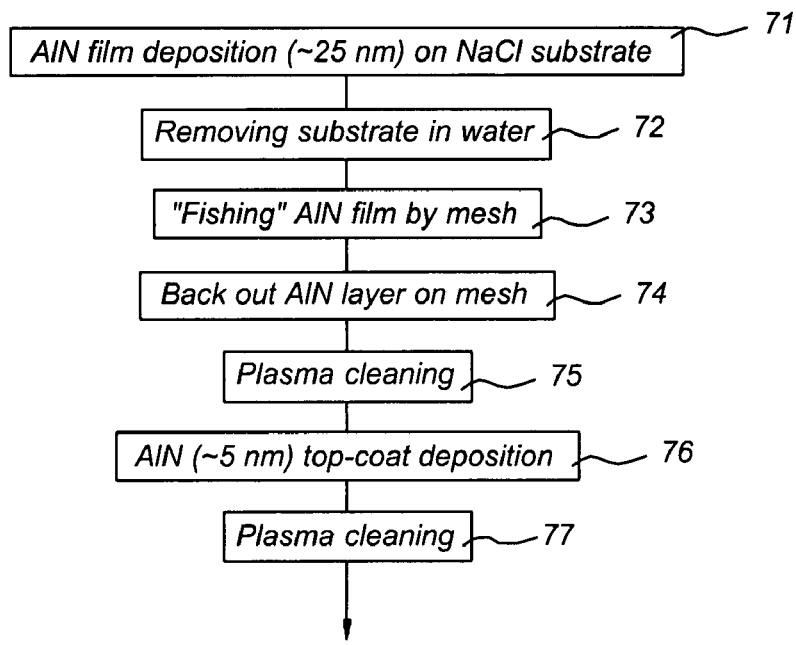
FIG. 7 is a flow diagram of another method for fabricating a filter window according to the invention.

In an alternative embodiment, a substrate is used which can be solved in for example water. FIG. 7 shows a flow chart of an exemplary embodiment. In this case, the method starts, at step 71, by depositing a AlN layer on a NaCl substrate. Then at step 72, the substrate is removed by solving it in water.

Next, at step 73, the AlN layer is "fished out" of the water by making contact with a mesh of wires. The AlN layer will stick to the mesh, due to the Van der Waal interaction. Then, at steps 74 and 75, the device is backed out and plasma cleaned respectively. The final steps are top-coat (or cap-layer) deposition and plasma cleaning, see steps 76 and 77.

In an embodiment, the device manufacturing method for fabricating a filter window comprises fabricating a second layer comprising a EUV transparent material, and depositing a third layer comprising at least one of AlN, Ru, Ir, Au, SiN, Rh, C. This sandwiched structure will result in an improved EUV absorption, i.e. lesser absorption.

The second layer may be fabricated by forming a base layer and elevated bars on top of the base layer. The pitch between the bars may be in the range of 500-5000 nm and a height of the bars is in the range of 200-500 nm. In a specific embodiment, the pitch of the bars is 1000 nm and the height of the bars is 400 nm.

While we have described above specific embodiments of the invention it will be appreciated that the invention may be practiced otherwise than described. The description is not intended to limit the invention. The invention can be used in lithography apparatus using any form of projection beam, especially EUV radiation having a wavelength in the range of 8 to 20 nm, in particular 9 to 16 nm.

What is claimed is:

1. A filter window manufacturing method, comprising:
   fabricating a structure of wires on a substrate;
   depositing a lacquer over the wires and the substrate;
   depositing a first layer over the lacquer, the first layer comprising a material selected from the group consisting of AlN, Ru, Ir, Au, SiN, Rh, C and combinations thereof;
   removing said lacquer;
   removing said substrate, and
   baking said first layer.

2. A filter window manufacturing method as in claim 1, wherein said removing said lacquer comprises heating to vaporize said lacquer.

3. A filter window manufacturing method according to claim 1, further comprising:
   fabricating a second layer comprising a material selected from the group consisting of Si, Be, $B_4C$, Mo, Zr, Nb, C, Al and combinations thereof; and
   depositing a third layer comprising a material selected from the group consisting of AlN, Ru, Ir, Au, SiN, Rh, C and combinations thereof.

4. A filter window manufacturing method comprising:
   depositing, onto a substrate soluble in a fluid, a first layer comprising a material selected from the group consisting of AlN, Ru, Ir, Au, SiN, Rh, C and combinations thereof;
   dissolving said substrate in the fluid;
   removing said first layer from the fluid by adhering said first layer to a wire structure; and
   baking said first layer.

5. A filter window manufacturing method according to claim 4, further comprising:
   fabricating a second layer comprising a material selected from the group consisting of Si, Be, $B_4C$, Mo, Zr, Nb, C, Al and combinations thereof; and
   depositing a third layer comprising a material selected from the group consisting of AlN, Ru, Ir, Au, SiN, Rh, C and combinations thereof.

6. A filter window manufacturing method according to claim 5, wherein said fabricating said second layer comprises fabricating a base layer and elevated bars on top of said base layer.

* * * * *